United States Patent
Baker et al.

(10) Patent No.: US 6,601,753 B2
(45) Date of Patent: Aug. 5, 2003

(54) VOID-FREE DIE ATTACHMENT METHOD WITH LOW MELTING METAL

(75) Inventors: Jay DeAvis Baker, Dearborn, MI (US); Lawrence Leroy Kneisel, Novi, MI (US); Mohan R. Paruchuri, Canton, MI (US); Prathap Amervai Reddy, Farmington Hills, MI (US); Vivek Amir Jairazbhoy, Farmington Hills, MI (US)

(73) Assignee: Visteon Global Technologies, Inc., Dearborn, MI (US)

(*) Notice: Subject to any disclaimer, the term of this patent is extended or adjusted under 35 U.S.C. 154(b) by 2 days.

(21) Appl. No.: 09/859,553

(22) Filed: May 17, 2001

(65) Prior Publication Data

US 2002/0170944 A1 Nov. 21, 2002

(51) Int. Cl.⁷ .................. B23K 35/38; B23K 31/02; H01L 21/44; H01L 23/495
(52) U.S. Cl. ................. 228/219; 228/121; 228/122.1; 228/123.1; 228/124.6; 228/212; 438/110; 438/111; 257/668
(58) Field of Search .................. 228/219, 121–123, 228/123.1, 124.5, 124.6, 212–214, 218; 257/666–668; 438/110, 111, 612; 357/81

(56) References Cited

U.S. PATENT DOCUMENTS

| | | | | |
|---|---|---|---|---|
| 3,931,388 A | * | 1/1976 | Hafner et al. ............ 310/344 |
| 4,081,825 A | * | 3/1978 | Koopman et al. ........... 357/81 |
| 4,577,398 A | * | 3/1986 | Sliwa et al. .................. 29/590 |
| 4,607,277 A | * | 8/1986 | Hassan et al. ............. 257/713 |
| 4,645,116 A | * | 2/1987 | Henein et al. .......... 228/123.1 |
| 4,757,934 A | | 7/1988 | Greenstein |
| 4,860,942 A | * | 8/1989 | Takvorian ............. 228/122.1 |
| 4,953,005 A | * | 8/1990 | Carlson et al. ............ 257/666 |
| 4,979,664 A | | 12/1990 | Lyons et al. |
| 5,173,766 A | * | 12/1992 | Long et al. .................. 257/668 |
| 5,182,632 A | * | 1/1993 | Bechtel et al. ............ 257/666 |
| 5,291,371 A | * | 3/1994 | Gruber et al. ............. 361/705 |
| 5,492,586 A | * | 2/1996 | Gorczyca .................... 156/245 |
| 5,523,628 A | * | 6/1996 | Williams et al. ........... 257/777 |
| 5,621,243 A | * | 4/1997 | Baba et al. ................. 257/737 |
| 5,628,111 A | | 5/1997 | Iwasaki et al. |
| 5,632,434 A | * | 5/1997 | Evans et al. ............... 228/44.7 |
| 5,998,242 A | * | 12/1999 | Kirkpatrick et al. ........ 438/118 |
| 6,027,957 A | * | 2/2000 | Merritt et al. ............. 310/344 |
| 6,054,189 A | * | 4/2000 | Bravet et al. .............. 156/247 |
| 6,064,217 A | * | 5/2000 | Smith ......................... 324/758 |
| 6,069,214 A | * | 5/2000 | McCormick et al. ....... 526/171 |
| 6,093,577 A | * | 7/2000 | van der Groen et al. ... 438/118 |
| 6,099,678 A | * | 8/2000 | Kotato et al. .............. 156/256 |
| 6,329,224 B1 | * | 12/2001 | Nguyen et al. ............. 438/111 |
| 6,400,034 B1 | * | 6/2002 | Kimura et al. ............. 257/737 |
| 6,458,681 B1 | * | 10/2002 | DiStefano et al. .......... 438/612 |
| 6,471,110 B1 | * | 10/2002 | Luechinger et al. ........ 228/102 |

* cited by examiner

Primary Examiner—Tom Dunn
Assistant Examiner—L. Edmondson
(74) Attorney, Agent, or Firm—Brinks Hofer Gilson & Lione

(57) ABSTRACT

A method for attaching an electronic die to a substrate is disclosed. Preferably, the method includes depositing a pad of low temperature die attachment material within a die attachment area on the substrate, positioning the die over the pad of low temperature die attachment material, and compressing the die against the substrate to expel air trapped within the pad of low temperature die attachment material. Further, a bead of containment material is deposited onto the substrate to define the die attachment area. In this manner, the die attachment material is contained on the substrate. Thus, the method of the present invention improves the reliability of the electronic die.

16 Claims, 3 Drawing Sheets

VOID-FREE DIE ATTACHMENT METHOD WITH LOW MELTING METAL

FIELD OF THE INVENTION

The present invention relates to methods for attaching integrated circuit dies to substrates.

BACKGROUND ART

Silicon dies having integrated circuits created therein are typically attached to a heat spreader or substrate. Wire bond is electrically fixed to the silicon die and bonding pad on the substrate to communicate electrical signals from the integrated circuits within the die to electronic circuits external to the die. The attachment of the silicon die to the substrate or heat spreader is of critical importance. The methods and materials used to attach the die to the substrate have a significant impact on the performance and reliability of the silicon die.

One prior art method for attaching the silicon die to the substrate utilizes high temperature solder material. While this method accomplishes its intended purpose, significant problems still exist. For example, attaching the silicon die with high temperature solder induces stresses in the die upon thermal cycling. These stresses are caused by the different coefficients of thermal expansion between the silicon die, solder, and substrate. Consequently, the induced stresses lead to early failure of the die.

Other methods for attaching the silicon die to the substrate to overcome the disadvantages stated above have been developed. For example, an improved method for attaching the silicon die utilizes low temperature solder. While this method for attaching the silicon die to the substrate or heat spreader eliminates the stresses induced in the die and thus significantly increases the die's life, significant problems still exist. For example, the use of this method creates voids and cracks in the solder material. The voids and cracks significantly increases thermal resistance in the solder material. Consequently, the increased thermal resistance raises the junction temperature and ultimately leads to premature failure of the silicon die.

Therefore, there is a need for a new and improved method for attaching a silicon die to a substrate. This new and improved method must reduce or eliminate thermal stresses in the silicon die and must increase the life in service of the silicon die.

SUMMARY OF THE INVENTION

In accordance with an aspect of the present invention, a new and improved method for attaching silicon die to a substrate is provided. The method of the present invention creates a void-free attachment of the silicon die to the substrate. More specifically, a low temperature die attachment material (i.e., solder) is used to affix the silicon die to the substrate.

In an embodiment of the present invention, the void-free attachment of the silicon die to the substrate is accomplished by exerting a downward force on the silicon die directed toward the substrate to ensure good contact between the die and the substrate through the low temperature die attachment material.

In another embodiment of the present invention, the force is created by clamping the die to the substrate using a pair of mechanical clamps.

In another embodiment of the present invention, a spring is disposed between a silicon die cover and the die. The spring exerts a downward force on the die directed toward the substrate, thus preventing air from becoming trapped in the solder.

Further objects, features and advantages of the invention will become apparent from consideration of the following description and the appended claims when taken in connection with the accompanying drawings.

BRIEF DESCRIPTION OF THE DRAWINGS

FIG. 1b is a cross-sectional view of the die and substrate of FIG. 1a;

FIG. 2b is a cross-sectional view through the die and substrate as indicated in FIG. 2a;

DETAILED DESCRIPTION OF THE PREFERRED EMBODIMENT

Figure 1A:
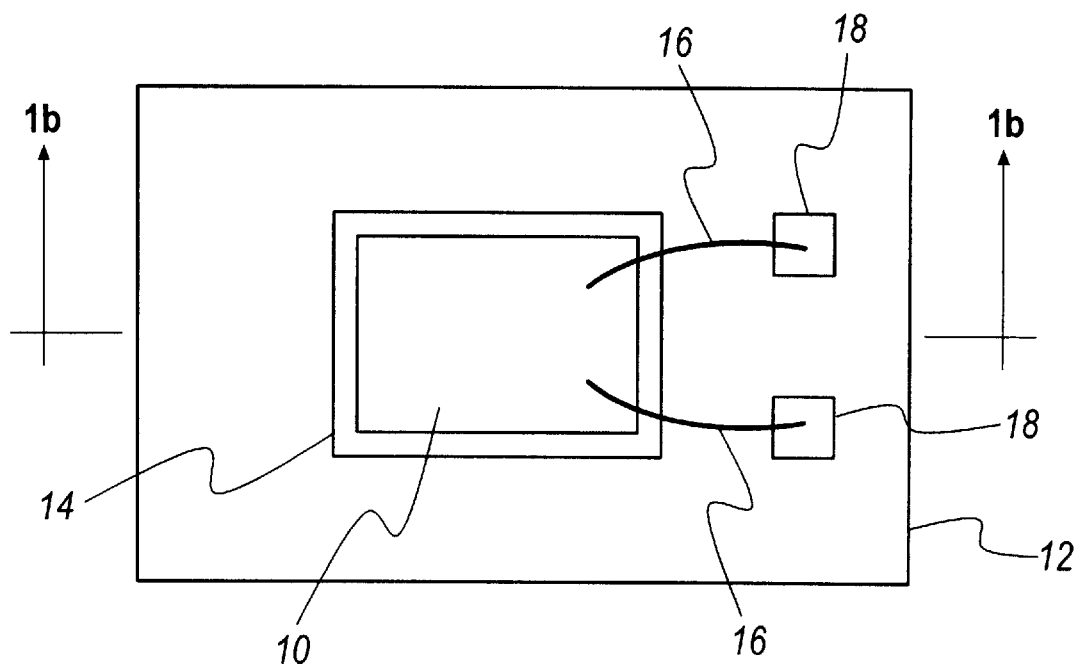
FIG. 1a is a top view of a die and substrate, wherein the die was attached to the substrate using prior art methods.
Figure 1B:
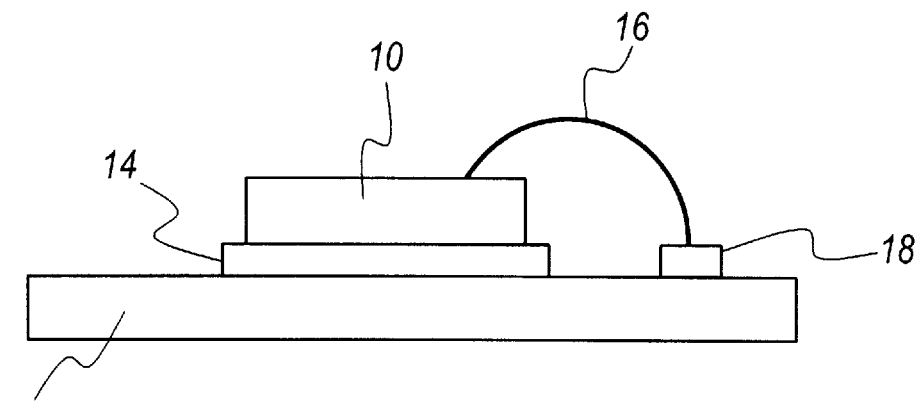

Referring now to FIGS. 1a and 1b, a top view of a prior art system for attaching a integrated circuit die to a substrate is illustrated. In this prior art method and system, an integrated circuit die 10, typically made of silicon, is affixed to a substrate or heat spreader 12. Conventionally, high temperature solder 14 is disposed between die 10 and substrate 12 to secure the die thereto.

After the die has been secured to substrate 12, wire bond 16 may be applied. Wire bond 16 is soldered or similarly affixed at one end to die 10 and at another end to a bond pad 18. Wire bond 16 communicates electrical signals between die 10 and bond pad 18. Bond pad 18, as well known in the art, is in communication with electrical circuits and electronic devices external to die 10.

While high temperature solder works to affix die 10 to substrate 12 problems arise through the use of this material. For example, high temperature solder 14 induces stresses in the die upon thermal cycling. The stresses are the result of the disparity in coefficients of thermal expansion between the die, solder, and substrate. A result of the induced stresses is premature failure of the die. The present invention, eliminates this problem and other problems as will be clear from the description of the method and system of the present invention as described below.

Figure 2A:
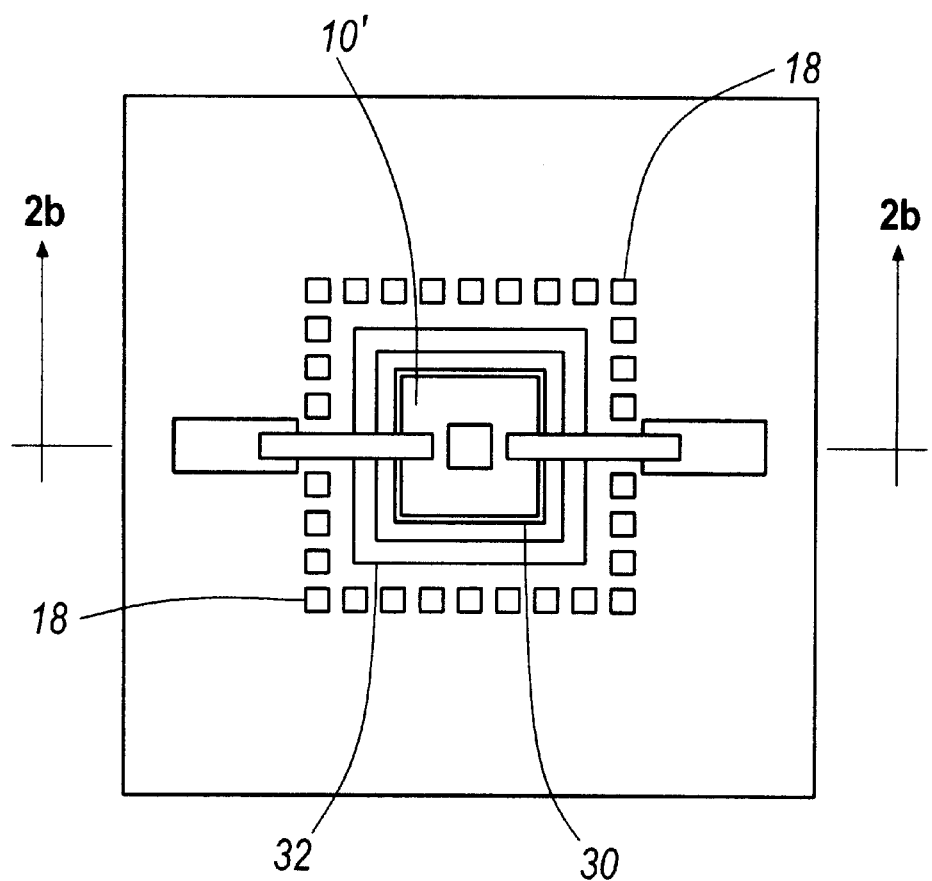
FIG. 2a is a top view of a die and substrate wherein the die is attached to the substrate using the system and method of the present invention.
Figure 2B:
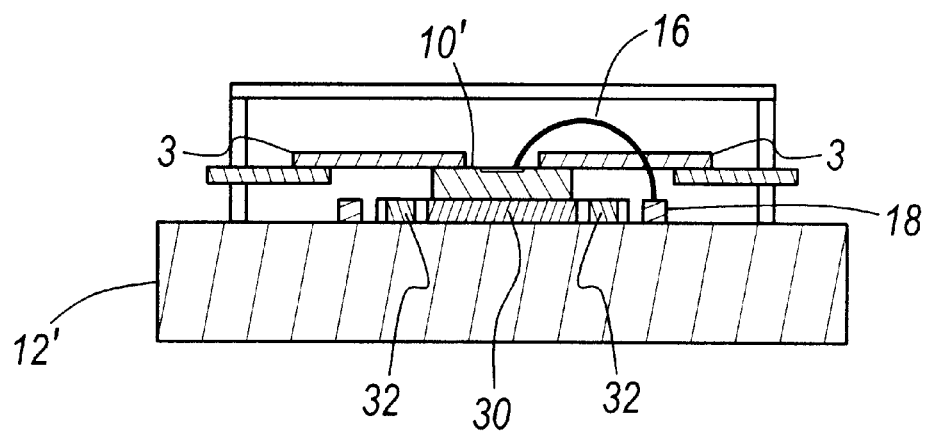

Referring now to FIG. 2a, a system and method for attaching a die 10' to a substrate 12' is illustrated, in accordance with the present invention. As illustrated in FIGS. 2a and 2b, the silicon die 10' is attached to the substrate 12' with a low temperature die attachment material 30. In a preferred embodiment, the low temperature die attachment material is low temperature solder. In order to contain the low temperature die attachment material 30 on substrate 12' and within the perimeter of die 10' a bead of containment material 32, such as epoxy or similar material is deposited around the die. Any other method of containment such as depositing high temperature solder around the die may also be used.

The method and system of the present invention further provide a pair of clamps 34 for exerting a downward force on the die directed toward the substrate 12'. This clamping force insures adequate contact between the die and the substrate through attachment material 30. Thus, the present invention eliminates air from being trapped in the solder. With the elimination of air entrapment in the attachment material 30, thermal resistance of the stack, die attachment material and substrate is significantly minimized and the die junction (junction between die and substrate) temperature is lowered. Consequently, the die may be operated at higher power levels with improved reliability. A further benefit of the present invention is that as the die attachment material, such as solder changes phase from solid to solidus to liquidus, the solder does not induce any stresses on the die. Thus, the method and system of the present invention through the use of attachment material 30 and clamps 34 significantly improves the reliability and life of die 10'.

Preferably, the low temperature solder is composed of low melting temperature alloys such as 82.7 by percent weight Bi, 17.3 weight percent Ga in a Bi—Ga solder system or 57 percent by weight Bi-17 Sn, 26 percent by weight In, or 52.5 percent by weight Bi, 15.5 percent by weight Sn and 32 percent by weight Pb.

Figure 3A:
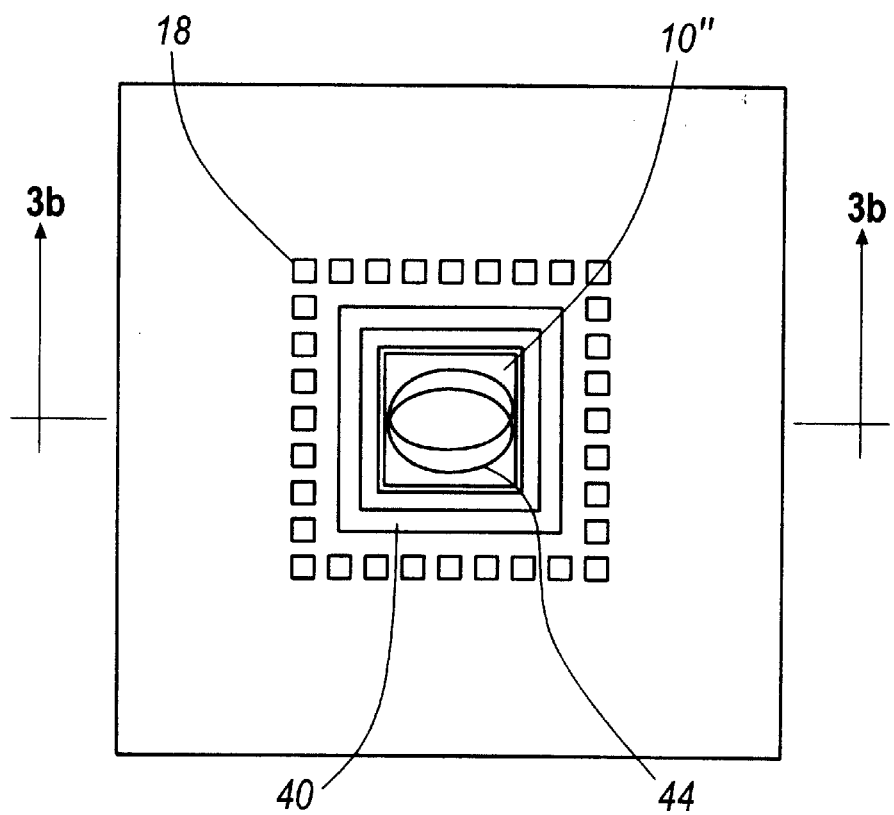
FIG. 3a is a top view of an embodiment of the present invention wherein a spring is used to exert a force on the die directed toward the substrate, in accordance with the present invention.
Figure 3B:
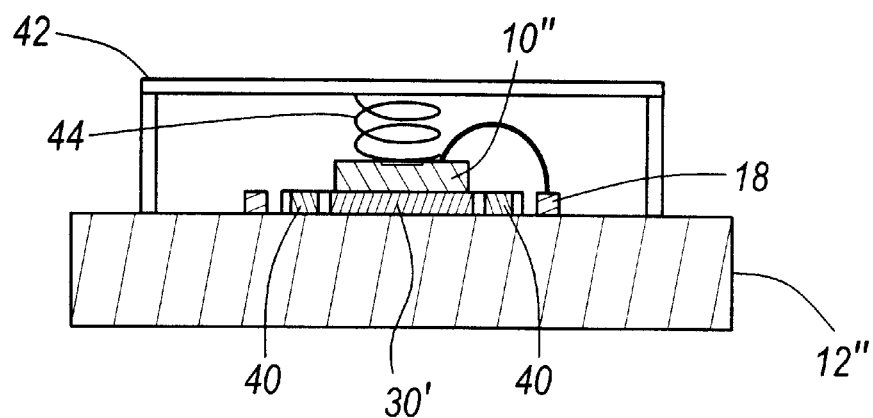
FIG. 3b is cross-sectional view through the die and substrate of FIG. 3a as indicated in FIG. 3a, in accordance with the present invention.

Referring now to FIG. 3, an alternate embodiment of the system and method for attaching a silicon die 10" or similar integrated circuit (or semiconductor material) to a substrate 12" is illustrated, in accordance with the present invention. In the present embodiment, die. 10" is secured to the substrate 12" using a low temperature die attachment material 30' such as low temperature solder. As in the embodiment described above, a bead of containment material 40 is deposited around the die perimeter to contain the flow of low temperature attachment 30'.

The die 10" and substrate 12" is enclosed within a hermetically sealed cover 42 to ensure voids in the solder do no occur by the existence of trapped air. Further, inert gas such as nitrogen is injected within the cover 42 as air is evacuated.

In order to ensure that air is not entrapped within the die attachment material 30', a spring 44 is positioned between the cover 42 and the die 10". Spring 44 exerts a downward force on die 10" forcing the die toward substrate 12" eliminating voids or air pockets in attachment material 30' by squeezing the die and substrate together.

The force exerted by spring 44 may be adjusted to an appropriate compression force as required for a given die size and attachment matrerial composition. As with the previously described embodiment, this system and method for mounting die 10" to substrate 12" has many advantages over the prior art. For example, a die operated at a lower temperature will have a longer operating life and higher reliability as compared to prior art systems and methods.

Therefore, the present invention solves many problems unaddressed by the prior art. For example, the various embodiments of the present invention provide void free attachment of an integrated circuit die to a substrate. Accordingly, the present invention reduces the stresses induced in the die by the attachment material thereby increasing the operational life of the die as well as the overall reliability of the system.

The foregoing discussion discloses and describes a preferred embodiment of the invention. One skilled in the art will readily recognize from such discussion, and from the accompanying drawings and claims, that changes and modifications can be made to the invention without departing from the true spirit and fair scope of the invention as defined in the following claims.

What is claimed is:

1. A method for attaching an electronic die to a substrate, the method comprising:
    depositing a pad of low temperature die attachment material within a die attachment area on the substrate, wherein the die attachment material changes phase at elevated die temperatures:
    positioning the die over the pad of low temperature die attachment material;
    dispensing a bead of containment material onto the substrate to define the die attachment area to contain the die attachment material therein;
    compressing the die against the substrate to expel air trapped within the pad of low temperature die attachment material;
    enclosing the die under a die cover; and
    expelling air from within the die cover by injecting a gas between the cover and the substrate.

2. The method of claim 1 wherein the bead of containment material is epoxy.

3. The method of claim 1 wherein compressing the die further comprises clamping the die to the substrate.

4. The method of claim 1 wherein the pad low temperature die attachment material is a low temperature solder.

5. The method of claim 1 wherein compressing the die further comprises exerting a compression force onto the die directed toward the substrate using a spring.

6. The method of claim 5 further comprising attaching the spring to the die cover, wherein the spring is compressed against the die when the die cover is secured to the substrate.

7. A system for attaching an electronic die to a substrate, the system comprising:
    a pad of low temperature die attachment material placed within a die attachment area on the substrate, wherein the die attachment material changes phase at elevated die temperatures, and wherein the die is positioned over the pad and a compression force is applied to the die directed towards the substrate to expel air trapped within the pad;
    a bead of containment material applied to the substrate to define the die attachment area to contain the die attachment material therein, wherein the bead of containment material is a bead of epoxy; and
    a die cover for enclosing the die to create a hermetically sealed environment, wherein air is expelled from between the die cover and the substrate by injecting a gas therebetween.

8. The system of claim 7 wherein the pad of low temperature die attachment material is a pad of low temperature solder.

9. The system of claim 7 further comprising clamps for fixedly securing and applying compression from the die toward the substrate.

10. The system of claim 7 further comprising a spring exerting compression force on the die directed toward the substrate.

11. The system of claim 10 wherein the spring is fixedly attached to the die cover and is compressed against the die when the die cover is secured to the substrate.

12. A method for attaching an electronic die to a substrate, the method comprising:
    depositing a pad of low temperature die attachment material within a die attachment area, the die attachment material being adapted to change phases;

positioning the die over the pad;

clamping the die to the substrate to expel air trapped within the pad dispensing a bead of containment material onto the substrate to define the die attachment area to contain the pad of low temperature die attachment material, wherein the bead of containment material is a bead of epoxy, and wherein the pad of low temperature die attachment material is a pad of low temperature solder;

enclosing the die under a die cover; and expelling air under the die cover by injecting a gas from between the die cover and the substrate.

13. A method for attaching an electronic die to a substrate, the method comprising:

depositing a pad of low temperature die attachment material within a die attachment area, wherein the pad is a pad of low temperature solder;

positioning the die over the pad;

applying a spring force against the die directed toward the substrate using a compression spring to expel air trapped within the pad;

dispensing a bead of containment material onto the substrate to define the die attachment area and to contain the pad, wherein the bead is a bead of epoxy;

enclosing the die under a die cover; and expelling air from within the die cover by injecting a gas between the die cover and the substrate.

14. A system for attaching an electronic die to a substrate, the system comprising:

a pad of low temperature die attachment material placed within a die attachment area, the die attachment material being adapted to change phases;

a clamp for contacting the die and securing the die to the substrate thereby exerting a downward force on the die to expel air trapped within the pad;

a bead of containment material dispensed onto the substrate to define the die attachment area, wherein the bead is a bead of epoxy; and a die cover for creating a hermetically sealed container for containing the die, wherein air is expelled from between the die cover and the substrate by injecting a gas into the die cover.

15. The system of claim 14 wherein the pad is a pad of low temperature solder.

16. A system for attaching an electronic die to a substrate, the system comprising:

a pad of low temperature die attachment material placed within a die attachment area, wherein the pad is a pad of low temperature solder;

a spring for exerting a force against the die directed toward the substrate to expel air trapped within the pad;

a bead of containment material dispensed onto the substrate to define a die attachment area, wherein the bead is a bead of epoxy; and a die cover for enclosing the die to create a hermetic seal, wherein air is expelled from between the die cover and the substrate by injecting a gas into the die cover.

\* \* \* \* \*